Figure 1:
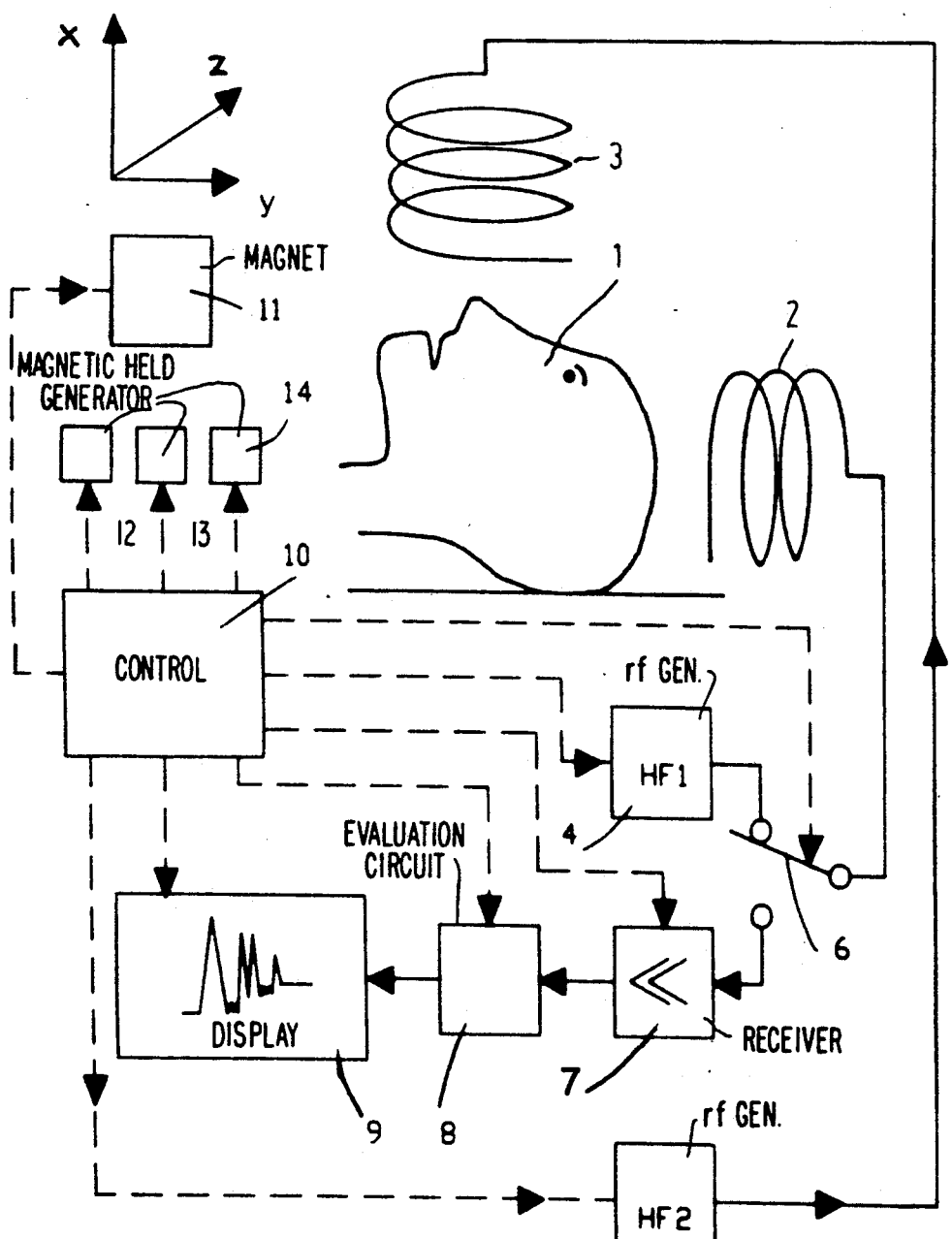

United States Patent [19]

Bomsdorf et al.

[11] Patent Number: 5,113,138
[45] Date of Patent: May 12, 1992

[54] CARBON MR SPECTROSCOPY METHOD AND DEVICE FOR PERFORMING THE METHOD

[75] Inventors: Hartwin Bomsdorf, Hamburg, Fed. Rep. of Germany; Graeme C. McKinnon, Zurich; Peter Bosiger, Ennetbaden, both of Switzerland

[73] Assignee: U.S. Philips Corporation, New York, N.Y.

[21] Appl. No.: 507,941

[22] Filed: Apr. 10, 1990

[30] Foreign Application Priority Data

Apr. 13, 1989 [DE] Fed. Rep. of Germany ....... 3912142

[51] Int. Cl.⁵ .............................................. G01R 33/20
[52] U.S. Cl. .................................................. 324/307
[58] Field of Search ............... 324/300, 307, 309, 310, 324/311, 312, 313, 308, 314, 318, 322; 128/653 A

[56] References Cited

U.S. PATENT DOCUMENTS

| | | | |
|---|---|---|---|
| 4,477,777 | 10/1984 | Gordon | 324/300 |
| 4,581,582 | 4/1986 | Redington | 324/309 |
| 4,585,993 | 4/1986 | Bottomley | 324/309 |
| 4,651,097 | 3/1987 | Iwaoka et al. | 324/309 |
| 4,769,602 | 9/1988 | Vinegar et al. | 324/303 |
| 4,799,015 | 1/1989 | Sepponen | 324/314 |
| 4,843,321 | 6/1989 | Sotak | 324/309 |
| 4,843,549 | 6/1989 | McKinnon | 324/309 |
| 4,868,503 | 9/1989 | McKinnon et al. | 324/309 |
| 4,893,080 | 1/1990 | Luyten et al. | 324/309 |
| 4,987,369 | 1/1991 | Van Stapele | 324/307 |

OTHER PUBLICATIONS

R. K. Harris, "Special Pulse Sequences and Two-Dimensional NMR", Nuclear Magnetic Resonance Spectroscopy: A Physicochemical View, pp. 165–179.

H. O. Kalinowski, S. Berger, & S. Braun, "INEPT-, Spin-Echo- und DEPT-Verfahren", C-NMR-SPEKTROSKOPIE, pp. 63–67.

W. P. Aue, S. Muller, T. A. Cross, & J. Seelig, "Volume-Selective Excitation. A Novel Approach to Topical NMR", JOURNAL OF MAGNETIC RESONANCE, vol. 56, 1984, pp. 350–354.

P. R. Luyten, A. J. H. Marien, B. Sijtsma, & J. A. Den Hollander, "Solvent-Suppressed Spatially Resolved Spectroscopy. An Approach to High-Resolution NMR on a Whole-Body MR System", JOURNAL OF MAGNETIC RESONANCE, vol. 67, 1986, pp. 148–155.

Primary Examiner—Michael J. Tokar
Attorney, Agent, or Firm—William Squire

[57] ABSTRACT

In localized carbon MR spectroscopy, three slice selective pulses which influence the nuclear magnetization in only one slice are generated before a subsequence which is suitable for polarization transfer.

6 Claims, 2 Drawing Sheets

CARBON MR SPECTROSCOPY METHOD AND DEVICE FOR PERFORMING THE METHOD

Of interest is commonly owned co-pending application entitled "Magnetic Resonance Method for Obtaining Selected Spectra", Ser. No. 361,456, filed Jun. 5, 1989 in the name of Johannes J. Van Valls, now Pat. No. 4,972,147.

The invention relates to a carbon MR spectroscopy method in which a number of sequences is applied to an examination zone in the presence of a uniform, steady magnetic field, each sequence involving first of all the excitation of the protons so that their nuclear magnetization has been rotated through 90° at a reference instant, after which the nuclear magnetization of hydrogen and carbon is excited by further rf pulses at a defined distance in time from the reference instant, after which the carbon spin resonance signal thus generated is subjected to a frequency analysis, and also relates to a device for performing this method.

According to this method, in each sequence initially rf pulses having the Larmor frequency of protons which, for a predetermined field strength, is approximately four times higher than the Larmor frequency of carbon (i.e. of the isotope $^{13}C$) are active in the examination zone. This proton excitation produces a polarization transfer which causes the carbon lines to appear with an increased amplitude when they are excited subsequent to the transfer. Methods of this kind are known from literature as DEPT or INEPT methods (for example, see Kalinowski et al "$^{13}$C-NMR-Speciroskopie", Thieme Verlag, 1984).

For medical diagnostics it is necessary to perform spectroscopic examinations which cover only a part of the overall examination zone, for example a given region within the skull of a patient. For this purpose it is thus necessary to localize the zone wherefrom the spectrum is to be determined.

Various localization methods are known, for example the so-called VSE method (J. Magn. Res. 56, 350-354 (1984)) or the SPARS method (Magnetic Resonance Imaging, Vol. 4, pp. 237-239, 1986). According to these methods the nuclear magnetization in the zone outside three mutually perpendicular slices is dephased, so that ultimately the nuclear magnetization remains non-influenced only in the zone of intersection of these three slices. When subsequently a DEPT or INEPT sequence is applied, this combination produces the carbon spectrum of a selectable volume zone.

Recently novel localization methods have been developed, for example STEVE (EP-A-233675) and VSR (EP-A-302550). These methods are better suitable for clinical praxis; they influence exclusively the nuclear magnetization in three mutually perpendicular slices and produce an echo signal in the zone of intersection of these three slices. Therefore, it is not readily possible to apply a VSR or STEVE sequence before a DEPT or INEPT sequence, as in the case of VSE or SPARS.

It is the object of the present invention to modify a sequence of the kind set forth so that it can be combined with one of the latter, preceding localization sequences so as to form an overall sequence. This object is achieved in accordance with the invention in that for the localization at least three slice-selective rf pulses having the Larmor frequency of water are generated, which pulses are used to produce an echo signal at the reference instant in the zone of intersection of the slices influenced by the three slice-selective rf pulses, two groups of sequences comprising the same number of sequences being applied, the sequences of one group being modified with respect to those of the other group so that the echo signals of one group, generated at the reference instant, have the opposite phase in relation to the echo signals of the other group the differences between the carbon spin resonance signals of the two groups being summed.

The invention is based on the following consideration: in the known OEPT oz INEPT sequences the protons (throughout the examination zone) are first excited by a 90° rf pulse. This first rf pulse is omitted and replaced by a preceding (STEVE or VSR) sequence which produces an echo signal at the (reference) instant at which the 90° rf pulse is generated in the known DEPT or INEPT sequences, thus producing a maximum of the nuclear magnetization in the zone of intersection at the reference instant.

The spin resonance excitation generated at the Larmor frequency of carbon subsequent to the polarization transfer acts not only on the zone of intersection, but also on the overall examination zone. In order to suppress the effect of the zones situated outside the zone of intersection, so-called phase cycling takes place with the two groups of sequences in accordance with the invention. The carbon MR signals then generated by the two groups have an opposed phase position, while the carbon spin resonance signals from the zones outside the zone of intersection have the same phase position. Therefore, when the difference between the spin resonance signals of the two groups is formed, the signal components originating from zones outside the zone of intersection are eliminated.

Figure 2:
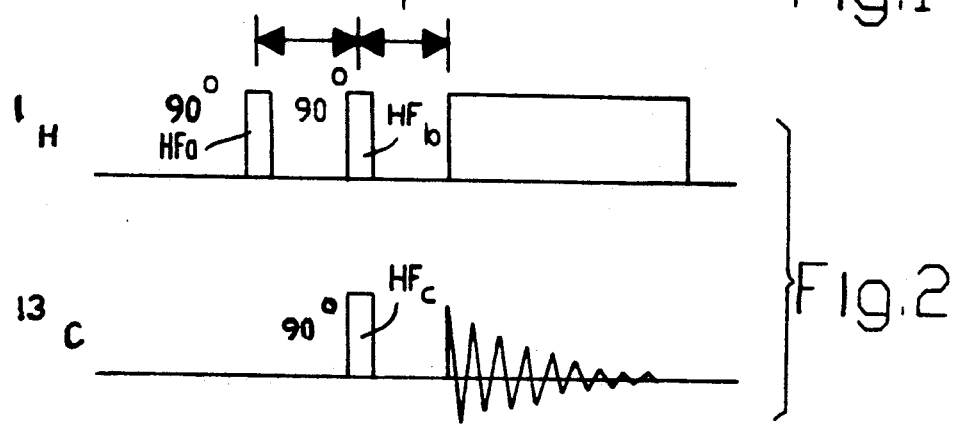
Figure 3:
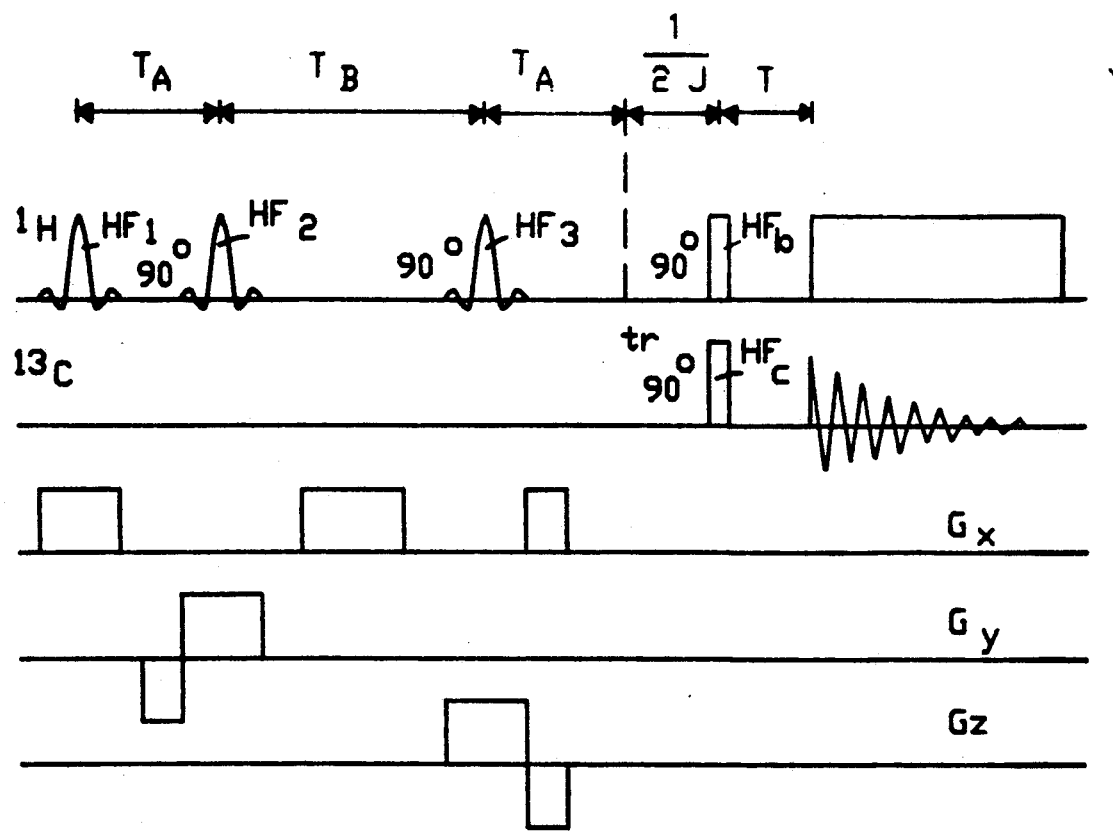
Figure 4:
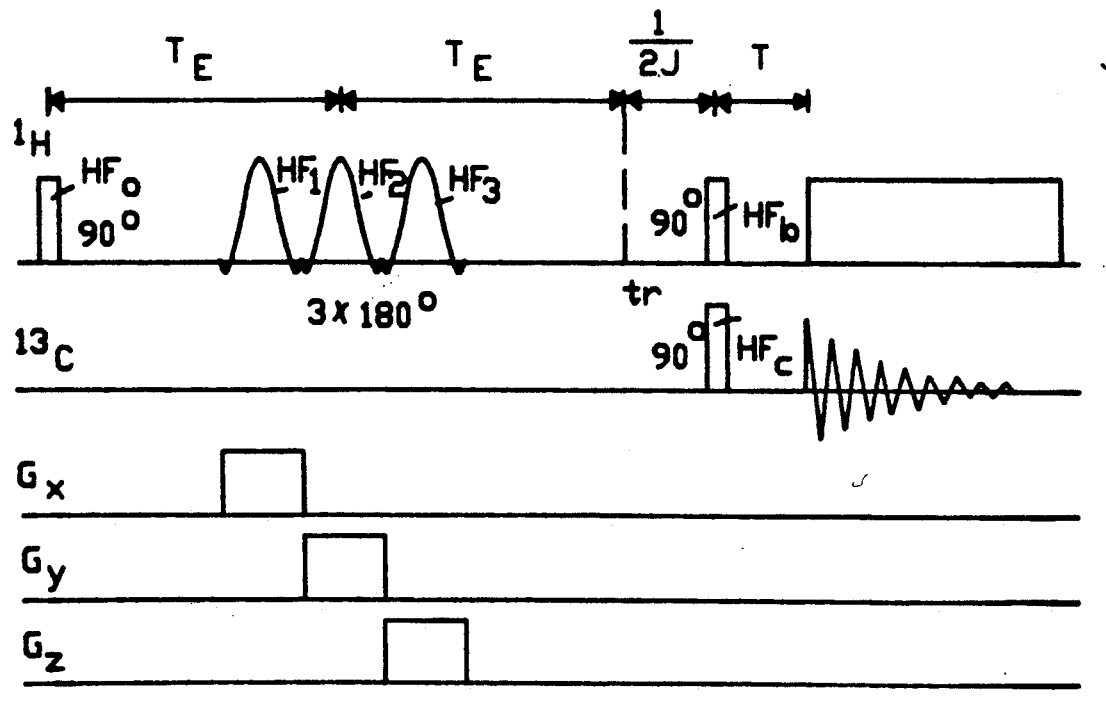

The invention will be described in detail hereinafter with reference to the drawing. Therein:

FIG. 1 shows a spin resonance spectrometer whereby the invention can be carried out, FIG. 2 shows a known version of an INEPT method, FIG. 3 shows a combination of the sequence shown in FIG. 2 and a STEVE sequence, and FIG. 4 shows the combination of a method as shown in FIG. 2 with a VSR sequence.

The reference numeral 1 in FIG. 1 denotes a patient arranged in the examination zone and exposed to a strong, uniform and steady magnetic field. This magnetic field, extending in the z-direction of a cartesian x-y-z coordinate system, is generated by a magnet 11 which is diagrammatically shown in the drawing; this magnet in reality encloses the examination zone. For purposes of spectroscopy, the induction of this magnetic field must be comparatively strong, for example four Tesla. At four Tesla, the Larmor frequency of $^{13}C$ nuclei amounts to approximately 42.8 MHz, the Larmor frequency of protons amounting to approximately 170 MHz.

The apparatus comprises a first rf generator 4 which generates oscillations at the Larmor frequency of carbon and which is connected, via a switch 6, to a first rf coil which is tuned to this frequency and which acts on the examination zone. A second rf generator 5 generates oscillations having the Larmor frequency of the (hydrogen) protons and is connected to an rf coil 3 which also generates a magnetic field which extends perpendicularly to the steady magnetic field in the examination zone.

The spin resonance signals produced in the examination zone at the Larmor frequency of carbon are detected by the coil 2 and applied to a receiver 7 via the switch 6. An evaluation circuit 8 is connected to the output of the receiver 7, which evaluation circuit forms the spectrum of the spin resonance signal received using Fourier transformation; this spectrum can be displayed on a suitable display unit 9. The components 4...9 are controlled by a control unit 10 which may include a suitable microcomputer or the like. The control unit 10 also controls the units 12, 13 and 14 which are only diagrammatically shown and which generate a magnetic field which is oriented in the z-direction and which has a gradient extending in the x-direction, the y-direction and the z-direction, respectively.

The two lines of FIG. 2 show the position in time of the rf magnetic fields generated by the coils 3 and 2 for a simplified version of an INEPT method. First of all, at the instant $t_r$ (first line) the coil 3 generates a 90° rf pulse $HF_a$ which rotates the nuclear magnetization of the protons in the examination zone through 90°. The vector of this nuclear magnetization comprises two components of mutually different frequency due to the J-coupling between the C atoms and the protons in the examination zone. At the instant $T = 1/2J$ after the first 90° rf pulse, at which the two components are exactly in phase opposition there is generated a further 90° rf pulse $HF_b$ which rotates one frequency component in the $+z$ direction and the other frequency component in the $-z$ direction. J is the strength of the J coupling between the protons and the carbon atoms (approximately 125 Hz in practice).

This results in a polarization transfer which can be used to generate a 90° rf pulse $HF_c$ at the Larmor frequency of carbon by means of the coil 2. Subsequently, the switch 6 is switched over, the spin resonance signal received by the coil 2 at the instant T after the second rf pulse of the coil 3 is amplified and demodulated in the receiver 7, and subjected to a Fourier transformation in the evaluation circuit 8, and the spectrum thus generated is displayed on the monitor display 9. If the two 90° rf pulses of the coil 3 were omitted, so that the polarization transfer would be eliminated, the amplitude of the spin resonance signal induced in the coil 2 would be approximately a factor 4 lower. During the reception of the spin resonance signal by the coil 2, the rf coil 3 generates an rf magnetic field at the Larmor frequency of the protons which suppresses the doublet structure of the carbon lines.

The combined sequence shown in FIG. 3 consists of two sub-sequences. The first sub-sequence corresponds to a so-called STEVE sequence and serves for localization. It comprises three 90° rf pulses (first line of FIG. 3) $HF_1$, $HF_2$ and $HF_3$. During the first 90° rf pulse $HF_1$, the magnetic field generator unit 12 is active so that a magnetic gradient field $G_x$ having a gradient in the x-direction is generated (third line). During the second rf pulse (at the distance $T_A$ from the first rf pulse) the magnetic field generator unit 13 is active, so that a magnetic gradient field $G_y$ having a gradient in the y direction is generated as denoted as shown on the fourth line of FIG. 3. The third 90° rf pulse $HF_3$, succeeding the second pulse at a distance in time $T_B$, is accompanied by a magnetic gradient field $G_z$, having a gradient in the z direction, which is generated by the magnetic field generator unit 14. The three rf pulses excite the nuclear magnetization in three mutually perpendicular slices. All spin resonance signals not originating from the zone of intersection of these three slices are dephased by a magnetic gradient field with gradients in the x-direction which are active between the second and the third rf pulse as well as after the third rf pulse. As is described in detail in EP-A-233675, only the stimulated echo signal originating from the zone of intersection of the three slices is not dephased. This stimulated echo signal appears in known manner after a period $T_A$ subsequent to the third rf pulse which corresponds to the distance in time between the first two rf pulses.

The subsequent sub-sequence deviates from that shown in FIG. 2 merely in that the first rf pulse $HF_a$ is omitted. The position of this sub-sequence with respect to the preceding sub-sequence ($HF_1$...$HF_3$) is chosen so that the reference instant $t_r$ at which the first 90° rf pulse occurs in the sequence shown in FIG. 2, is identical to the instant at which the stimulated echo signal from the zone of intersection defined by the three slice selective rf pulses $HF_1$...$HF_3$) occurs. Thus, this reference instant is situated a period of time $T_A$ after the third rf pulse $HF_3$ and a period of time $\frac{1}{2}$ J before the rf pulse $HF_b$. At the reference instant no rf pulse is generated (as in the sequence shown in FIG. 2), but at the reference instant a transverse magnetization is again present in the area of intersection determined by three rf pulses $HF_1$...$HF_3$ and the accompanying magnetic gradient fields $G_x$...$G_z$.

The rf pulse $HF_c$ of carbon Larmor frequency acts on the carbon atoms not only in the zone of intersection of the three slices in which the polarization transfer has occurred, but also outside this zone of intersection (in which no polarization transfer has occurred). The carbon spin resonance signal induced into the coil 2 in each sequence at the instant T after the rf pulses $HF_b$ and $HF_c$, therefore contains not only components from the zone of intersection but also components which are influenced by the examination zone outside the zone of intersection. The latter components are undesirable because they impede localization. They are suppressed by means of phase cycling which implies the application of two different groups of sequences.

The sequences of one group deviate from the sequences of the other group in that the polarization transfer takes place with a 180° phase shift. This can be achieved, for example in that in one group the first rf pulse $HF_1$ has the same phase position as the rf pulses $HF_2$ and $HF_3$, and has the opposite phase position in the other group. As a result, the phase position of the echo signal occurring at the reference instant is rotated through 180°. Consequently, the carbon spin resonance signal occurring at the instant T in both sequences contains components which originate from the zone of intersection and which have the opposite phase position and also components from zones outside the zone of intersection which have the same phase position. The latter, undesirable components are suppressed in that the carbon spin resonance of the two sequences are subtracted. When this operation is repeated and the resultant differences are summed, the sum signal thus formed depends only on the carbon atoms in the zone of intersection even though localization has been achieved by means of the three pulses $HF_1$...$HF_3$ at the Larmor frequency of the protons. The signal thus formed by summing the differences is frequency-analysed by Fourier transformation.

This localization by means of three slice selective rf pulses of proton Larmor frequency is more exact than a localization performed by slice-selective pulses of carbon Larmor frequency, because the bandwidth of the proton spin resonance signal is substantially smaller than the bandwidth of the carbon spin resonance signals. FIG. 3 shows only a single sequence; a representation of the sequences associated with the two different groups of sequences has been omitted because they are identical except for the phase relations between the individual rf pulses.

The three slice selective rf pulses $HF_1...HF_3$ can be used also for DEPT or INEPT sequences other than those shown in FIG. 2. To this end it is merely necessary to omit the first rf pulse having the Larmor frequency of hydrogen and the stimulated echo signal must occur at the reference instant at which the first 90° rf pulse must be generated in the relevant DEPT or INEPT sequence.

In the sequence shown in FIG. 4 first of all a 90° rf pulse $HF_0$ having the Larmor frequency of hydrogen is generated; during this rf pulse, no magnetic gradient field is applied. This rf pulse is succeeded by three rf pulses $HF_1$, $HF_2$ and $HF_3$ having the Larmor frequency of water, which pulses are accompanied by a magnetic gradient field with a gradient extending in the x-direction, the y-direction and the z-direction, respectively (see the lines 3 to 5 of FIG. 4). The three rf pulses $HF_1...HF_3$ are situated at the same distance from one another, the central rf pulse $HF_2$ being situated at a distance $T_E$ from the rf pulse $HF_O$. The three slice-selective rf pulses $HF_1...HF_3$ generate, in conjunction with the rf pulse $HF_O$, a spin echo signal in the zone of intersection of the three slices influenced by the three pulses $HF_1...HF_3$. The spin resonance signals from the zones situated outside this zone of intersection are dephased by the gradient fields $G_x$, $G_y$ and $G_z$ applied during the three 180° rf pulses. The spin echo signal appears at the instant $T_E$ after the second rf pulse $HF_2$. The modified sequence of FIG. 2 by omission of the first rf pulse $HF_a$) is linked to the rf pulses $HF_0...HF_3$ so that the reference instant $t_R$ is situated at the distance $T_E$ from the second rf pulse $HF_2$ and is situated at a distance in time equal to ½ J from the subsequent rf pulse $HF_b$.

The spin resonance signal induced into the coil 2 is determined by the $^{13}C$ nuclei in the entire examination zone. In order to obtain a signal which depends only on the zone of intersection influenced by the polarization transfer, phase cycling is performed as already described with reference to FIG. 3. This can be realised in the simplest way by ensuring that in the sequences of one group the first rf pulse $HF_0$ always has the same phase position as the rf pulses $HF_1...HF_3$, whilst in the sequences of the second group the first rf pulse $HF_0$ has the opposite phase position in relation to the rf pulses $HF_1...HF_3$. By forming the difference again between the carbon spin resonance signals generated during the sequences of the different groups and by summing the differences, a spin resonance signal is obtained which is determined only by the $^{13}C$ nuclei in the zone of intersection of the three slices excited by the three rf pulses $HF_1...HF_3$.

Again combination is possible with DEPT or INEPT sequences other than those shown in FIG. 2 when the sub-sequences are linked so that the spin echo signal from the zone of intersection occurs at the instant at which the first 90° rf pulse (omitted for the localization) occurs in the relevant DEPT or INEPT sequence.

We claim:
1. A carbon MR spectrocopy method in which a number of sequences is applied to an examination zone in the presence of a uniform, steady magnetic field, each sequence involving the excitation of the protons so that their nuclear magnetization has been rotated through 90° at a reference instant ($t_r$), after which the nuclear magnetization of hydrogen and carbon is excited by further rf pulses ($HF_b$, $HF_c$) at a defined distance in time from the reference instant, after which the carbon spin resonance signal thus generated is subjected to a frequency analysis, for the localization at least three slice-selective rf pulses ($HF_1...HF_3$) having the Larmor frequency of water are generated, which pulses are used to produce an echo signal at the reference instant in the zone of intersection of the slices influenced by the three slice-selective rf pulses, two groups of sequences comprising the same number of sequences being applied, the sequences of one group being modified with respect to those of the other group so that the echo signals of one group generated at the reference instant have the opposite phase in relation to the echo signals of the other group the differences between the carbon spin resonance signals of the two groups being summed.

2. A method as claimed in claim 1, characterized in that the three slice-selective rf pulses are 90° rf pulses ($HF_1...HF_3$), the distance in time ($T_A$) between the first two rf pulses ($HF_1...HF_2$) corresponding to the distance in time between the third ($HF_3$) of these three slice selective rf pulses and the reference instant ($t_r$), between the three rf pulses as well as between the third rf pulse and the reference instant there being applied magnetic gradient fields having such an amplitude and duration that all spin resonance signals are suppressed by dephasing except for the stimulated echo signal from the zone of intersection of the three slices.

3. A method as claimed in claim 2, characterized in that the first of the three slice selective rf pulses has the same phase position as the other two slice selective rf pulses ($HF_2$, $HF_3$) in one group of sequences and has the opposite phase position with respect thereto in the other group of sequences.

4. A method as claimed in claim 1, characterized in that the sequence comprises a 90° rf pulse ($HF_0$) which is followed by three slice selective 180° rf pulses ($HF_1...HF_3$) at the same time distance from one another, the time distance ($T_E$) between the 90° rf pulse and the second 180° pulse being equal to the distance in time between the second rf pulse ($HF_2$) and the reference instant ($t_r$).

5. A method as claimed in claim 4, characterized in that the rf pulse ($HF_0$) preceding the three slice selective 180° rf pulses ($HF_1...HF_3$) has the same phase position as the three rf pulses in one group and has the opposite phase position with respect thereto in the other group of sequences.

6. A device comprising a magnet for generating a uniform, steady magnetic field, means for generating and receiving rf magnetic fields at the Larmor frequencies of hydrogen and carbon, means for generating magnetic gradient fields with gradients extending in three mutually perpendicular directions, and control means for controlling each said means for generating, said control means including means programmed so that first three slice-selective rf pulses ($HF_1...HF_3$) are generated at the Larmor frequency of water, after which each time at least one rf pulse ($HF_b$, $HF_c$) is generated at the Larmor frequency of hydrogen and carbon, the spin resonance signal arising of Larmor frequency of carbon in the zone of intersection of the three slices being used for the spectrum.

* * * * *